(12) United States Patent
Oh et al.

(10) Patent No.: US 7,248,494 B2
(45) Date of Patent: Jul. 24, 2007

(54) SEMICONDUCTOR MEMORY DEVICE CAPABLE OF COMPENSATING FOR LEAKAGE CURRENT

(75) Inventors: Hyung-Rok Oh, Seongnam-si (KR); Baek-Hyung Cho, Hwaseong-si (KR); Choong-Keun Kwak, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/220,294

(22) Filed: Sep. 6, 2005

(65) Prior Publication Data
US 2006/0050548 A1    Mar. 9, 2006

(30) Foreign Application Priority Data
Sep. 6, 2004    (KR) ...................... 10-2004-0070758

(51) Int. Cl.
*G11C 11/00* (2006.01)
(52) U.S. Cl. ........................ 365/148; 365/163; 365/210
(58) Field of Classification Search ................ 365/148, 365/163, 210
See application file for complete search history.

(56) References Cited

U.S. PATENT DOCUMENTS

| | | | |
|---|---|---|---|
| 4,371,956 A * | 2/1983 | Maeda et al. | 365/185.21 |
| 6,343,039 B2 * | 1/2002 | Agawa et al. | 365/203 |
| 6,487,113 B1 | 11/2002 | Park et al. | |
| 6,683,313 B2 | 1/2004 | Chen et al. | |
| 2004/0022085 A1 | 2/2004 | Parkinson et al. | |
| 2005/0219914 A1 * | 10/2005 | Sarin et al. | 365/189.01 |

* cited by examiner

*Primary Examiner*—Hoai V. Ho
(74) *Attorney, Agent, or Firm*—F. Chau & Assoc., LLC

(57) ABSTRACT

A semiconductor memory device compensates leakage current. A plurality of memory cells is disposed at intersections of word lines and bit lines. A plurality of dummy cells is connected to at least one dummy bit line. A leakage compensation circuit is connected to the at least one dummy bit line that outputs a leakage compensation current to at least one of the bit lines. A read current supply circuit outputs a read current necessary for a read operation to at least one of the bit lines in response to a first control signal. The memory device is a phase-change memory device containing phase-change material. The semiconductor memory device compensates leakage current in a read operation and supplies the leakage compensation current to a selected bit line, thereby suppressing error operation occurrence caused by leakage current.

19 Claims, 6 Drawing Sheets

SEMICONDUCTOR MEMORY DEVICE CAPABLE OF COMPENSATING FOR LEAKAGE CURRENT

CROSS-REFERENCE TO RELATED APPLICATION

This application claims priority from Korean Patent Application No. 2004-70758 filed Sep. 6, 2004, the contents of which is incorporated by reference herein in its entirety.

BACKGROUND OF THE INVENTION

1. Field of the Invention

The present invention relates to a semiconductor memory device, and more particularly, to a phase-change memory device for compensating for a leakage current in a read operation.

2. Description of the Related Art

When a Phase-Change Random Access Memory (PRAM) is heated and then cooled, the PRAM is maintained in one of two states, and is made of phase-change material such as chalcogenide alloy that can be again changeable by a heating and cooling operation. The two states are a crystalline state and an amorphous state. The PRAM has been disclosed and described in U.S. Pat. No. 6,487,113 and U.S. Pat. No. 6,480,438.

In a PRAM, the resistance is low in the crystalline state and is high in the amorphous state. The logic value of the PRAM is determined as 0 or 1 by the resistance value. The crystalline state corresponds to set or logic 0, and the amorphous state corresponds to reset or logic 1.

To change the phase-change material of the PRAM to its amorphous state, the PRAM is heated by resistance heat above the melting point of the phase-change material, and then is rapidly cooled. To change the phase-change material to the crystalline state, the phase-change material is heated for a predetermined time at a temperature under the melting point.

The kernel of the phase-change memory is the phase-change material, such as chalcogenide. The phase-change material, generally called a GST alloy, contains germanium (Ge), antimony (Sb) and tellurium (Te). The GST alloy has the properties of being rapidly changed by a heating and cooling operation between the amorphous state (reset or 1) and the crystalline state (set or 0), and thus it can be usefully applied to a memory device.

Phase-change materials have a high resistance in the amorphous state and a low resistance in the crystalline state.

A memory cell made of chalcogenide as a phase-change material includes a top electrode, a chalcogenide layer, a bottom electrode contact, a bottom electrode and an access transistor. The operation of reading a programmed cell is performed by measuring the resistance of the chalcogenide material. Programming, or the write operation, denotes that a memory cell has reset and set states and has corresponding logic values of 1 and 0 respectively.

Writing data in a memory cell is accomplished by heating chalcogenide above its melting point and then by rapidly cooling it to enter its amorphous state, or by heating it at a temperature under its melting point, maintaining the temperature for a predetermined time and then cooling it to enter its crystalline state.

FIGS. 1A and 1B illustrate a conventional memory cell in set and reset states.

A memory cell 100 includes a top electrode 12 having conductivity, formed on a phase-change material 14. A bottom electrode contact (BEC) 16 having conductivity connects the top electrode 12 and the phase-change material 14 with a bottom electrode 18 having conductivity.

Referring to FIG. 1A, the memory cell 100 is in the set state or the logic 0 state. In this state the phase-change material 14 has a crystalline state. Referring to FIG. 1B, the memory cell 100 is in the reset state or the logic 1 state. In this state the phase-change material 14 has an amorphous state.

FIGS. 1A and 1B respectively include an access transistor N20 for controlling the current flowing through the memory cell. When current flows through the memory cell 100, the bottom electrode contact 16 operates as a heater for heating the phase-change material 14 to change its state.

FIG. 2 illustrates an electric circuit configuration of a memory cell shown in FIGS. 1A and 1B.

In FIG. 2, a word line WL controls the activation of the memory cell 100. A current ICELL flowing through the memory cell 100 and a bit line BL are used in programming or reading the memory cell 100.

FIG. 3 illustrates conventional time-temperature curves for programming the phase-change material. FIG. 3 also shows the correlation between the time and the temperature of a programming pulse for programming the phase-change material to a set or reset state according to a conventional programming method.

In FIG. 3, a reset curve 35 illustrates the time-temperature correlation of a reset pulse, and a set curve 36 illustrates the time-temperature correlation of a set pulse.

With reference to the reset curve 35 of FIG. 3, to program the phase-change material to the reset state, the phase-change material is heated above its melting point Tm. Next, heat is applied to the phase-change material for a short time. Then the phase-change material is cooled rapidly. In the set curve 36 of FIG. 3, to program the phase-change material to the set state, the phase-change material is heated to a temperature under its melting point Tm. The temperature corresponds to a set window provided between the melting point Tm and a crystalline temperature Tx. The temperature is maintained for a predetermined time and then the phase-change material is cooled.

FIG. 4 illustrates a conventional current-voltage curve of the phase-change material.

Referring to FIG. 4, there is a reset state ① and a set state ③ for a read operation, and a program state ② to program the phase-change material to a set state. For the read operation of a memory cell, a voltage applied to the phase-change material should be smaller than a threshold voltage Vth of the phase-change material. A voltage Vread for the read operation is applied to the phase-change material in a range of, e.g., 0.4Vth-0.6Vth. For a read operation, a read current Iread is applied to the bit line of the memory cell.

When a leakage current escapes to non-selected memory cells connected to the same bit line, the read current Iread necessary for a read operation cannot be sufficiently supplied to the selected memory cell, which may cause read error. Such an error operation may become larger by increased integration and lower power consumption of semiconductor memory devices.

Thus, if leakage current in a read operation can be compensated, integration of semiconductor memory devices can be increased and error operations caused by leakage current can be prevented.

SUMMARY OF THE INVENTION

An exemplary embodiment of the invention provides a semiconductor memory device capable of controlling the amount of read current applied to a phase-change material in consideration of a leakage current. The semiconductor memory device facilitates high-integration and low power consumption.

Another exemplary embodiment of the invention provides a phase-change memory device capable of substantially reducing or preventing error operations caused by leakage current, and a method of applying read current in a read operation.

According to an aspect of the invention, a semiconductor memory device comprises a plurality of memory cells disposed at intersections of word lines and bit lines, a plurality of dummy cells connected to at least one dummy bit line, a leakage compensation circuit connected to the at least one dummy bit line that outputs a leakage compensation current to at least one of the bit lines, and a read current supply circuit that outputs a read current necessary for a read operation to at least one of the bit lines in response to a first control signal.

The memory cells of the memory device are phase-change memory cells.

Each dummy cell of the memory device includes a transistor of which a gate and a source are connected to a ground voltage, and a drain is connected to one terminal of a resistor made of phase-change material where another terminal of the resistor is connected to the at least one dummy bit line.

The memory device further comprises a mode selection circuit that connects the at least one dummy bit line with the leakage compensation circuit in response to a second control signal.

The first control signal contains read operation information.

The memory device further comprises a column selection circuit for connecting a selected bit line with the leakage compensation circuit and the read current supply circuit in response to a column selection signal.

The memory device further comprises a dummy column selection transistor of which a gate is connected to a power source voltage, a source is connected to the at least one dummy bit line and a drain is connected to the leakage compensation circuit.

The memory device further comprises a clamping circuit for clamping a voltage of at least one of the bit lines at a predetermined level in a read operation in response to a third control signal.

The memory device further comprises a dummy clamping circuit for clamping a voltage of the at least one dummy bit line at a predetermined level in a read operation in response to the third control signal.

According to another aspect of the invention, a semiconductor memory device includes a plurality of memory arrays. The memory array includes a plurality of memory mats. The memory mat includes a plurality of memory blocks. The memory block includes a plurality of memory cells disposed at intersections of word lines and bit lines, a plurality of dummy cells connected to a first dummy bit line positioned in a first end of the memory block, a leakage compensation circuit that is connected to the first dummy bit line that outputs a leakage compensation current to at least one of the bit lines, and a read current supply circuit for outputting a read current necessary for a read operation to at least one of the bit lines in response to a first control signal.

The memory device further comprises a dummy bit line positioned in a second end of the memory block.

The memory device further comprises a mode selection circuit for connecting the first dummy bit line with the leakage compensation circuit in response to a second control signal.

The memory cells are phase-change memory cells, where each memory cell includes a first transistor of which a gate is connected to at least one of the word lines, a source is connected to a ground voltage and a drain is connected to one terminal of a first resistor made of phase-change material where another terminal of the resistor is connected to at least one of the bit lines. Each dummy cell includes a second transistor, of which a gate and a source are connected to the ground voltage and a drain is connected to one terminal of a second resistor made of phase-change material where another terminal of the second resistor is connected to the first dummy bit line.

The memory device further comprises a column selection circuit for connecting a selected bit line with the leakage compensation circuit and the read current supply circuit in response to a column selection signal.

The memory device further comprises a clamping circuit for clamping a voltage of at least one of the bit lines and the first dummy bit line at a predetermined level in a read operation in response to a third control signal.

The memory device is a phase-change memory device containing phase-change material. The semiconductor memory device of the invention compensates a leakage current in a read operation and supplies it to a selected bit line, thus suppressing error occurrences caused by the leakage current.

BRIEF DESCRIPTION OF THE DRAWINGS

Exemplary embodiments of the invention are described with reference to the accompanying drawings, of which.

DETAILED DESCRIPTION OF PREFERRED EMBODIMENTS

Exemplary embodiments of the present invention will be described with reference to FIGS. 5 to 7 in which like components having like functions have been provided with like reference symbols and numerals.

Figure 5:
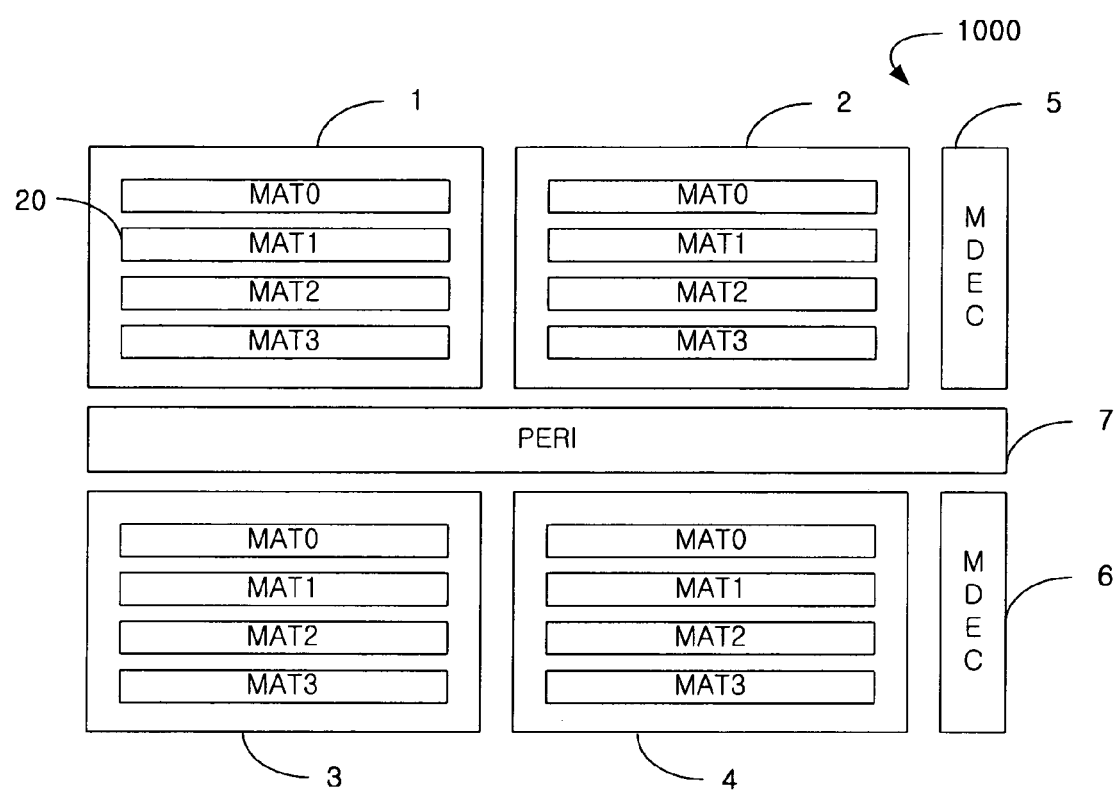
FIG. 5 depicts a layout of a semiconductor memory device according to an exemplary embodiment of the invention.

FIG. 5 depicts a layout of a semiconductor memory device according to an exemplary embodiment of the invention.

Figure 6A:
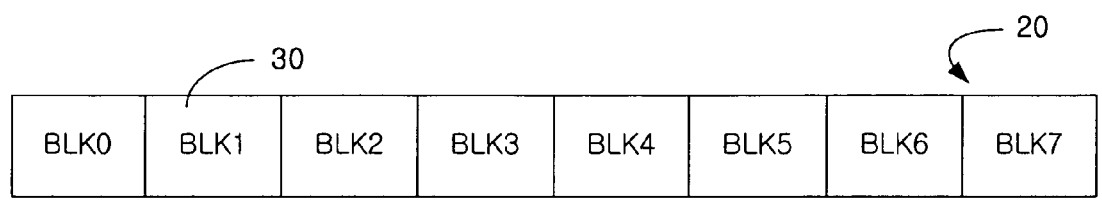
FIG. 6A illustrates a structure of a memory mat shown in FIG. 5.

FIG. 6A illustrates a structure of a memory mat shown in FIG. 5.

Figure 6B:
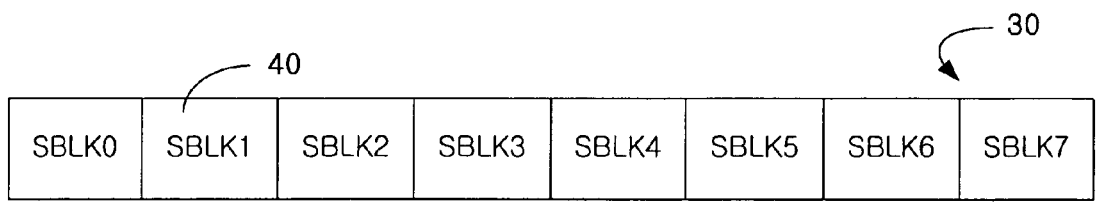
FIG. 6B illustrates a structure of a memory block shown in FIG. 6A.

FIG. 6B illustrates a structure of a memory block shown in FIG. 6A.

Figure 7:
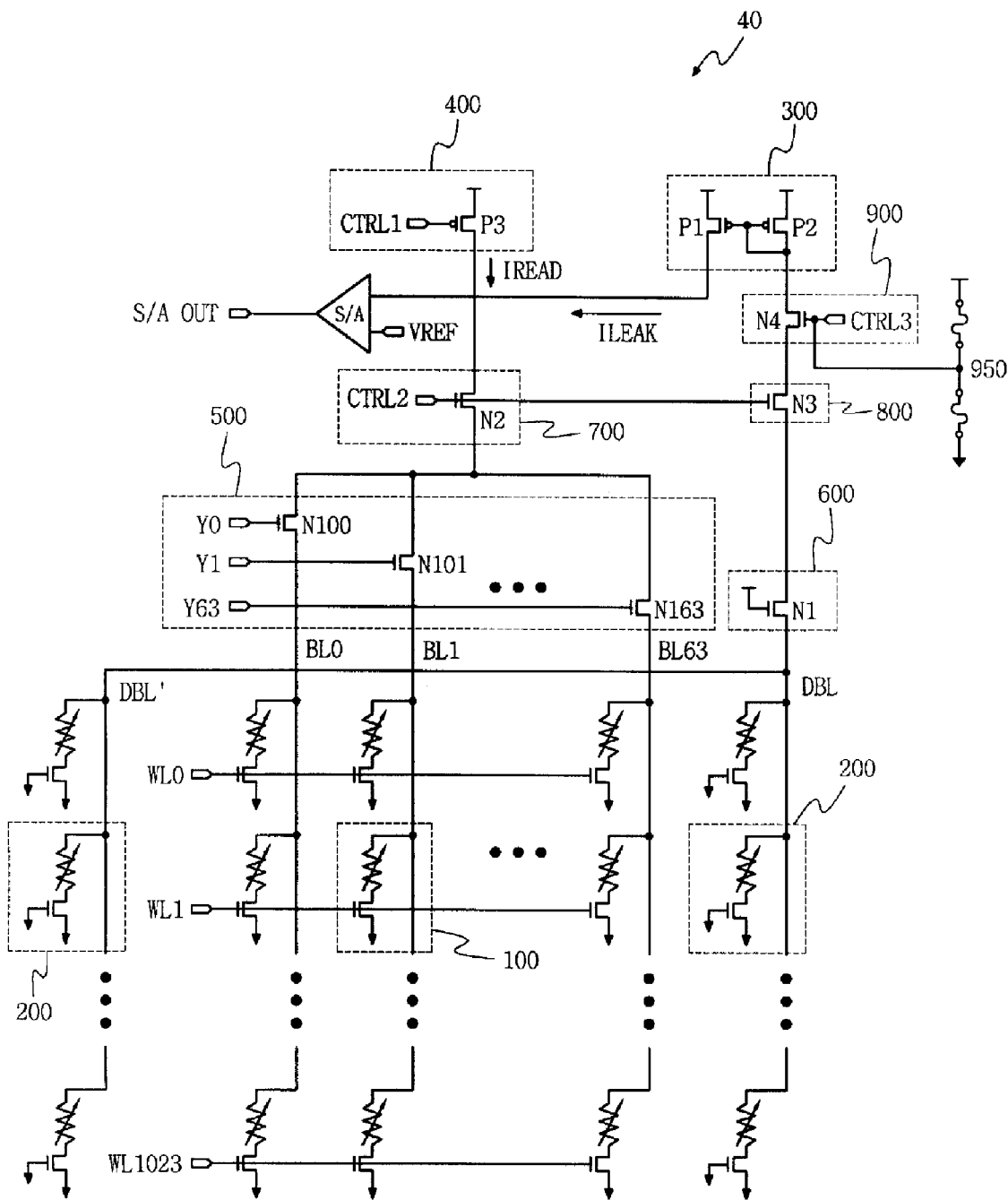
FIG. 7 illustrates a memory sub-block shown in FIG. 6B.

FIG. 7 illustrates a memory sub-block shown in FIG. 6B.

Referring to FIGS. 5 to 7, configuration and operation of a semiconductor memory device will be described as follows, according to an exemplary embodiment of the invention. The memory device is a phase-change memory device having a plurality of memory cells formed of phase-change material.

With reference to FIG. 5, a semiconductor memory device 1000 includes a plurality of memory arrays 1-4, main row decoders MDEC 5 and 6, and a peripheral circuit PERI 7. Each of the memory arrays 1-4 includes a plurality of memory mats 20 MAT0-MAT3. The respective memory arrays 1-4 include a column decoder and a sub word lline decoder (not shown). The peripheral circuit PERI 7 includes an input/output (I/O) buffer, an address buffer and a control buffer (not shown).

Referring to FIG. 6A, each of the memory mats 20 MAT0-MAT3 includes a plurality of memory blocks 30 BLK0-BLK7. With reference to FIG. 6B, each of the memory blocks 30 BLK0-BLK7 includes a plurality of memory sub-blocks 40 SBLK0-SBLK7. For example, it is assumed that a storage capacity of semiconductor memory device 1000 according to an exemplary embodiment of the invention is 64 Mbit, and each storage capacity of the memory arrays 1-4 is 16 Mbit. Each storage capacity of the memory mats 20 MAT0-MAT3 is 4 Mbit, and each storage capacity of the memory blocks 30 BLK0-BLK7 is 512 Kbit, and each storage capacity of the memory sub-blocks 40 SBLK0-SBLK7 is 64 Kbit.

FIG. 7 illustrates a circuit of one memory sub-block 40 shown in FIG. 6B. The memory sub-block 40 includes a plurality of memory cells 100, a plurality of dummy cells 200, a leakage compensation circuit 300, a read current supply circuit 400, a column selection circuit 500, a dummy column selection circuit 600, a clamping circuit 700, a dummy clamping circuit 800, a mode selection circuit 900 and a sense amplifier.

A memory cell 100 includes an access transistor, of which a gate is connected to a word line WL0-WL1023, one terminal is coupled with a ground voltage and another terminal is coupled with one terminal of a resistor made of phase-change material where the other terminal of the resistor is connected to a bit line BL0-BL63. In an exemplary embodiment of the invention, the phase-change memory cell implemented with an access transistor and a resistance is described, but the invention can be applied to a phase-change memory cell (not shown) implemented with a diode and a resistance, and also to a phase-change memory cell (not shown) in which one portion of the phase-change material is coupled with a ground voltage, a gate of an access transistor is coupled with a word line, one terminal of the access transistor is connected to another portion of the phase-change material, and another terminal of the access transistor is connected to a bit line.

A dummy cell 200 includes an access transistor of which a gate and one terminal are coupled with a ground voltage and another terminal is coupled with one terminal of a resistor made of phase-change material where the other terminal of the resistor is connected through other circuits to a dummy bit line DBL. The structure of the dummy cell is basically the same as that of the memory cell. Since the gate of the access transistor of the dummy cell 200 is connected to a ground voltage, it has an off state. In the structure of a dummy cell 200, another exemplary embodiment of the invention can be applied with only an access transistor of which a gate and one terminal are coupled with a ground voltage and another terminal is coupled with a dummy bit line, without the resistor, (not shown). The memory cell 100 and the dummy cell 200 have the same size.

A leakage compensation circuit 300 includes a first P-type Metal Oxide Semiconductor (PMOS) transistor P1 of which one terminal is coupled through other circuits with a bit line BL0-BL63, another terminal is coupled with an internal power source voltage Vdd and a gate is connected to a gate of a second PMOS transistor P2, where the second PMOS transistor P2 has a gate and one terminal connected through other circuits to the dummy bit line DBL and another terminal is connected to an internal power source voltage Vdd. The leakage compensation circuit 300 senses leakage current flowing in the dummy bit line DBL and supplies through other circuits a compensated leakage current ILEAK to a bit line BL0-BL63.

A read current supply circuit 400 includes a third PMOS transistor P3 of which a gate receives a first control signal CTRL1, one terminal is coupled with a terminal of the first PMOS transistor P1 of the leakage compensation circuit 300, and another terminal is connected to an internal power source voltage Vdd. The first control signal CTRL1 is a signal having read operation information or is a DC signal having a given voltage level. The read current supply circuit 400 supplies through other circuits a current IREAD necessary for a read operation to a selected bit line BL0-BL63.

A column selection circuit 500 connects through other circuits a selected bit line BL0-BL63 with the leakage compensation circuit 300 and the read current supply circuit 400 in response to a column selection signal Y1-Y63.

A dummy column selection circuit 600 includes a first NMOS transistor N1 of which a gate is connected to an internal power source voltage Vdd, one terminal is connected to the dummy bit line DBL and another terminal is connected through other circuits to the leakage compensation circuit 300. Since the gate of the first NMOS transistor N1 is coupled with the internal power source voltage Vdd, it has an on state.

Figure 1A:
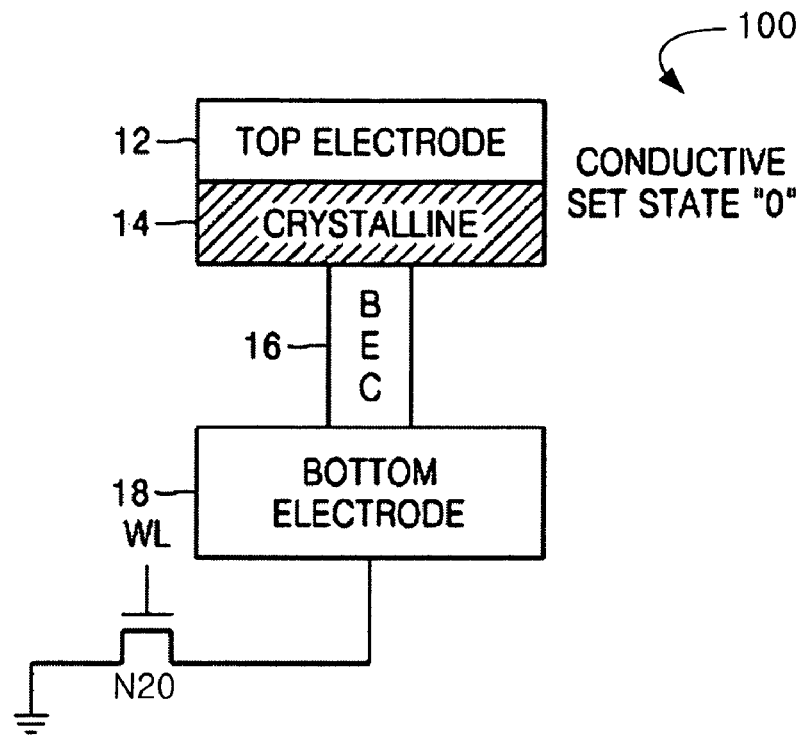
FIG. 1A illustrates a conventional memory cell in a set state.
Figure 1B:
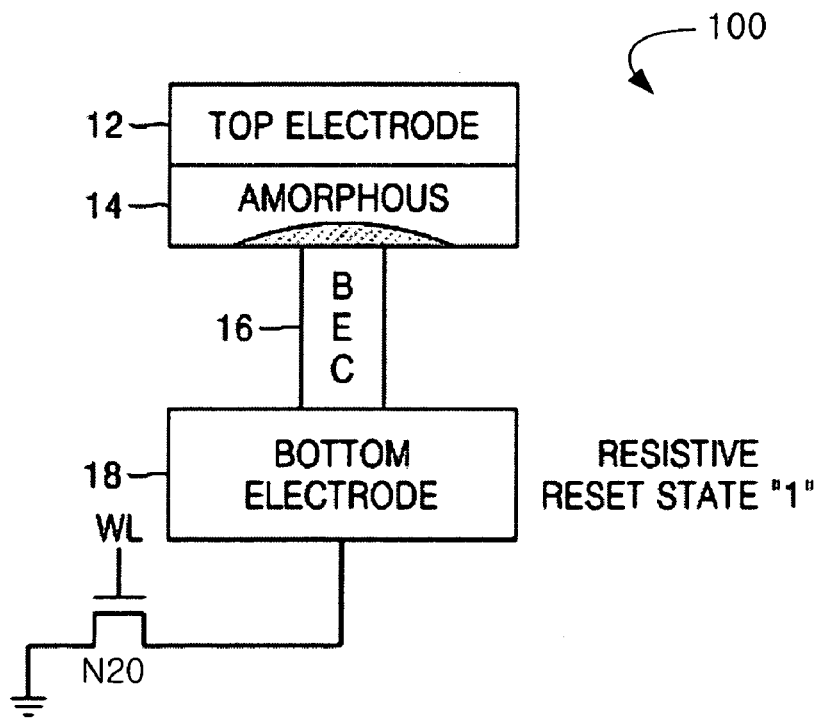
FIG. 1B illustrates a memory cell in a reset state.
Figure 2:
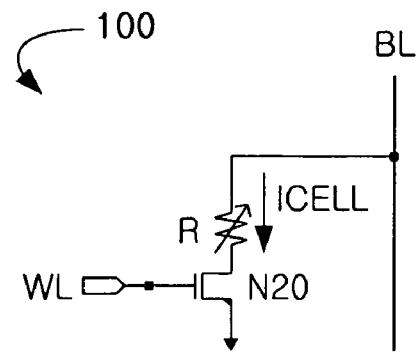
FIG. 2 illustrates a conventional electric circuit configuration of a memory cell shown in FIGS. 1A and 1B.
Figure 3:
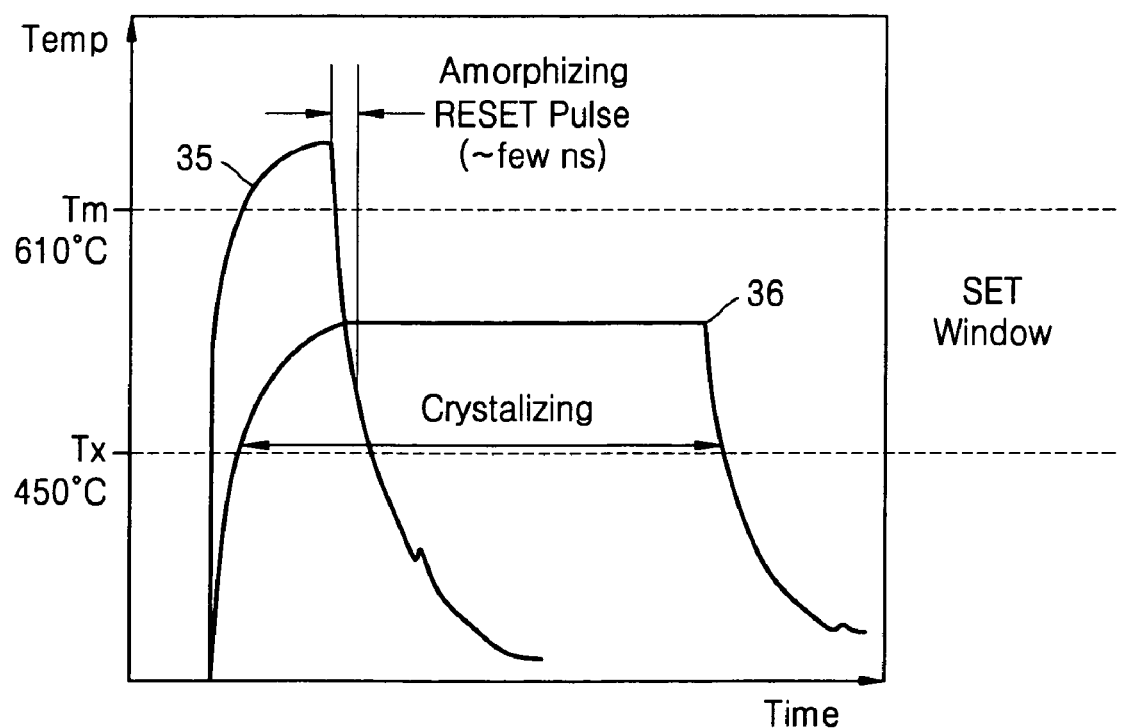
FIG. 3 illustrates conventional time-temperature curves for programming the phase-change material.
Figure 4:
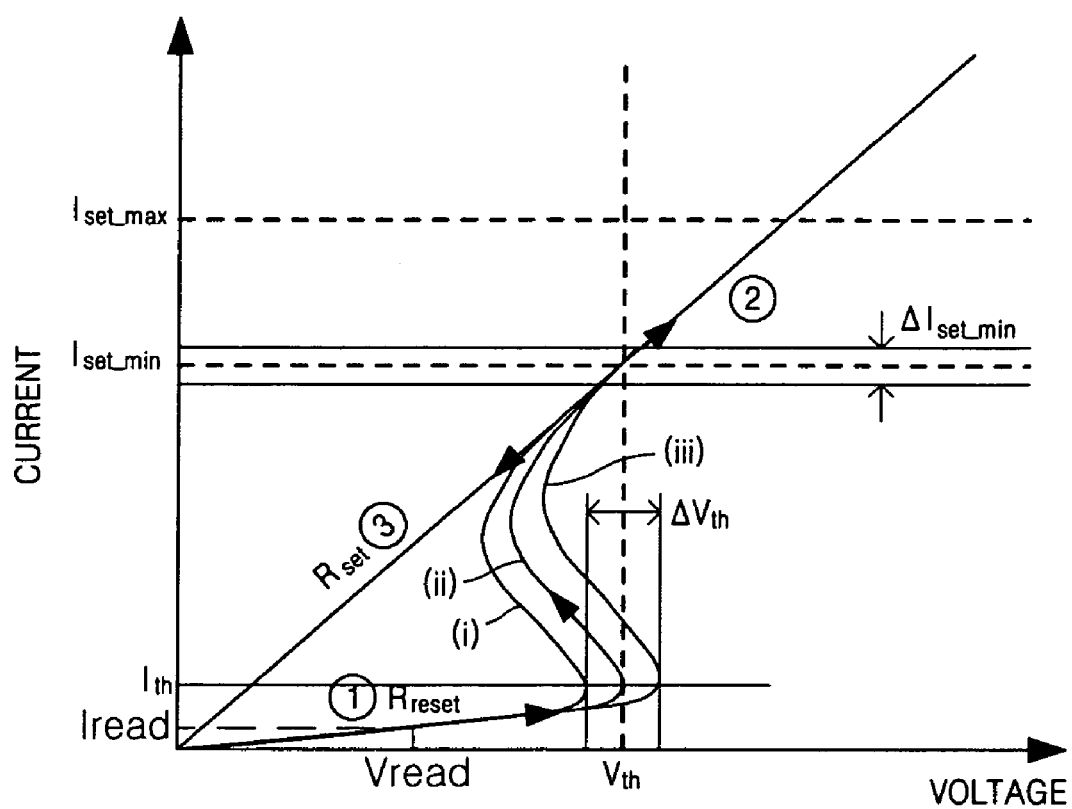
FIG. 4 illustrates a conventional current-voltage curve of the phase-change material.

A clamping circuit 700 includes a second NMOS transistor N2 of which a gate is connected to a second control signal CTRL2, one terminal is connected to the column selection circuit 500 and another terminal is connected with the leakage compensation circuit 300 and the read current supply circuit 400. The second control signal CTRL2 clamps a bit line selected by the column selection circuit 500 at a predetermined voltage level in a read operation. With reference to FIG. 4, the Vread voltage level corresponds to that predetermined voltage level. The second control signal CTRL2 has a voltage level of Vread+Vth3 when a threshold voltage of the second NMOS transistor N2 is Vth3.

A dummy clamping circuit 800 includes a third NMOS transistor N3 of which a gate is connected to the second control signal CTRL2, one terminal is connected to the dummy column selection circuit 600 and another terminal is connected through other circuits to the leakage compensation circuit 300.

A mode selection circuit 900 includes a fourth NMOS transistor N4 of which a gate is coupled with a third control signal CTRL 3, one terminal is coupled with the dummy clamping circuit 800 and another terminal is coupled with the leakage compensation circuit 300. The third control signal CTRL3 has a voltage level of the internal power source voltage Vdd when compensating for a leakage current in a read operation, and has a voltage level of ground voltage GND when a leakage current is not compensated. For that, a fuse circuit 950 can be used such as an electrical fuse or a laser fuse (not shown). Though the mode selection circuit 900 was implemented with an NMOS transistor N4 according to this exemplary embodiment, it can be in implemented with a PMOS transistor.

According to an exemplary embodiment of the invention, the operation of a semiconductor memory device will be described, as follows.

Referring to FIG. 4, to perform a read operation of a phase-change memory device according to an exemplary embodiment, a read current Iread is supplied to a selected memory cell. However, as shown in FIG. 7, when a leakage current escapes to a non-selected memory cell, the read current IREAD necessary for a read operation cannot be sufficiently supplied to the selected memory cell. This is of little concern when the amount of leakage current of the phase-change memory device is negligible, but if the amount of leakage current is not negligible, it must be compensated or an error is caused in a read operation. In other words, an error is caused in a sense amplifier and the error is output through an I/O line (not shown) connected to an output of the sense amplifier.

To compensate the leakage current, a plurality of dummy cells are provided according to an exemplary embodiment of the invention Referring to FIG. 7, one dummy bit line DBL is configured for every memory sub-block 40, and leakage current flowing through the dummy bit line DBL is sensed and a compensated leakage current ILEAK is supplied to a selected bit line of the memory cell Though one dummy bit line DBL was configured for every memory sub-block according to an exemplary embodiment of the invention, as shown in FIG. 6A, one dummy bit line DBL can be installed for every memory block BLK0-BLK7 or a right dummy bit line DBL and a left dummy bit line DBL can be installed for every memory block BLK0-BLK7.

As described above, according to an exemplary embodiment of the invention, a semiconductor memory device compensates for leakage current in a read operation if necessary, and supplies leakage compensation current to a selected bit line, thereby suppressing error occurrences caused by leakage current.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A semiconductor memory device, comprising:
   a plurality of phase-change memory cells disposed at intersections of word lines and bit lines:
   a plurality of dummy cells connected to at least one dummy bit line;
   a leakage compensation circuit connected to the at least one dummy bit line that outputs a leakage compensation current to at least one of the bit lines; and
   a read current supply circuit that outputs a read current necessary for a read operation to at least one of the bit lines in response to a first control signal.

2. The device of claim 1, wherein each dummy cell includes a transistor of which a gate and a source are connected to a ground voltage, and a drain is connected to one terminal of a resistor made of phase-change material where another terminal of the resistor is connected to the at least one dummy bit line.

3. The device of claim 1, further comprising a mode selection circuit that connects the at least one dummy bit line with the leakage compensation circuit in response to a third control signal.

4. The device of claim 3, wherein the third control signal is determined based on a voltage level connected through a fuse circuit.

5. The device of claim 1, wherein the first control signal contains read operation information.

6. The device of claim 1, wherein the first control signal is a DC signal.

7. The device of claim 1, further comprising a column selection circuit for connecting a selected bit line with the leakage compensation circuit and the read current supply circuit in response to a column selection signal.

8. The device of claim 7, further comprising a dummy column selection circuit of which a gate is connected to a power source voltage, a source is connected to the at least one dummy bit line and a drain is connected to the leakage compensation circuit.

9. The device of claim 7 further comprising a clamping circuit for clamping a voltage of at least one of the bit lines at a predetermined level in a read operation in response to a second control signal.

10. The device of claim 9, further comprising a dummy clamping circuit for clamping a voltage of the at least one dummy bit line at a predetermined level in a read operation in response to the second control signal.

11. A semiconductor memory device including a plurality of memory arrays, the device comprising:
    a plurality of memory mats comprising each memory array; and
    a plurality of memory blocks comprising each memory mat,
    where the memory block comprises,
    plurality of phase-change memory cells disposed at intersections of word lines and bit lines;
    a plurality of dummy cell is connected to a first dummy bit line positioned in a first end of the memory block;
    a leakage compensation circuit that is connected to the first dummy bit line that outputs a leakage compensation current to at least one of the bit lines; and
    a read current supply circuit for outputting a read current necessary for a read operation to at least one of the bit lines in response to a first control signal.

12. The device of claim 11 further composing a second dummy bit line positioned in a second end of the memory block.

13. The device of claim 11 further comprising a mode selection circuit for connecting the first dummy bit line with the leakage compensation circuit in response to a third control signal.

14. The device of claim 11 wherein each memory cell includes a first transistor of which a gate is connected to at least one of the word lines, a source is connected to a ground voltage and a drain is connected to one terminal of a first resistor made of phase-change material where another terminal of the first resistor is connected to at least one of the bit lines, and
    each dummy cell includes a second transistor of which a gate and a source are connected to the ground voltage, and a drain is connected to one terminal of a second resistor made of phase-change material where another terminal of the second resistor is connected to the first dummy bit line.

15. The device of claim 14 further comprising a column selection circuit for connecting a selected bit line with the leakage compensation circuit and the read current supply circuit in response to a column selection signal.

16. The device of claim 15, further comprising a clamping circuit for clamping a voltage of at least one of the bit lines and the first dummy bit me at a predetermined level in a read operation in response to a second control signal.

17. A semiconductor memory device, comprising:
- a plurality of phase-change memory cells disposed at intersections of word lines and bit lines:
- a read current supply circuit for supplying a read current determined in a read operation to a sensing node connected to one of the bit lines;
- a leakage compensation circuit for generating a leakage compensation current based on an amount of leakage current flowing through on-selected memory cells connected to the same one of the bit lines, and for applying the leakage compensation current to the sensing node; arid
- a sense amplifier circuit for comparing a voltage of the sensing node, to which the leakage compensation current was applied, with a sensing reference voltage, and for performing a data read opera don for a selected memory cell.

18. The device of claim 17 wherein the leakage compensation on circuit senses leakage current flowing through dummy cells adjacent to the memory cells.

19. A read operation method in a phase-change memory device having a plurality of phase-change memory cells disposed at intersections of word lines and bit lines, the method comprising:
- applying a read current to the bit line of a selected memory cell;
- sensing leakage current for non-selected memory cells connected to the same bit line;
- generating a leakage compensation current corresponding to an amount of the leakage current, and applying the leakage compensating current to a sensing node;
- comparing a voltage of the sensing node, to which the leakage compensation current was applied, with a sensing reference voltage; and
- reading out data stored in the selected memory cell.

* * * * *